United States Patent
Koezuka et al.

(10) Patent No.: US 7,879,701 B2
(45) Date of Patent: Feb. 1, 2011

(54) MANUFACTURING METHOD OF SEMICONDUCTOR DEVICE

(75) Inventors: Junichi Koezuka, Kanagawa (JP); Hiroshi Ohki, Kanagawa (JP); Taku Hasegawa, Kanagawa (JP); Mami Goto, Hokkai-do (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 776 days.

(21) Appl. No.: 11/474,499

(22) Filed: Jun. 26, 2006

(65) Prior Publication Data

US 2007/0023700 A1 Feb. 1, 2007

(30) Foreign Application Priority Data

Jun. 30, 2005 (JP) .............................. 2005-191532

(51) Int. Cl.
*H01L 21/425* (2006.01)
(52) U.S. Cl. ....................... 438/514; 438/510
(58) Field of Classification Search ................. 438/510, 438/513, 514
See application file for complete search history.

(56) References Cited

U.S. PATENT DOCUMENTS

| | | | |
|---|---|---|---|
| 5,804,471 A | 9/1998 | Yamazaki et al. | |
| 6,033,973 A | 3/2000 | Takemura | |
| 6,936,844 B1 | 8/2005 | Yamazaki et al. | |
| 6,995,079 B2 | 2/2006 | Koezuka et al. | |
| 7,026,764 B2 | 4/2006 | Nakamura | |
| 7,446,326 B2* | 11/2008 | Chaney et al. | 250/492.21 |
| 7,521,699 B2* | 4/2009 | Yamazaki et al. | 250/492.21 |
| 2004/0112537 A1 | 6/2004 | Yamazaki et al. | |
| 2005/0269639 A1 | 12/2005 | Yamazaki et al. | |
| 2006/0006348 A1* | 1/2006 | Yamazaki et al. | 250/492.21 |

FOREIGN PATENT DOCUMENTS

| | | |
|---|---|---|
| EP | 1 041 641 A2 | 10/2000 |
| JP | 2000-349298 | 12/2000 |

\* cited by examiner

*Primary Examiner*—Bradley K Smith
(74) *Attorney, Agent, or Firm*—Nixon Peabody LLP; Jeffrey L. Costellia

(57) ABSTRACT

Doping with suppressed filament deterioration can be performed even in the case of doping in various conditions with an ion doping apparatus having a filament. After ion doping is completed, supply of a material gas is stopped and hydrogen or a rare gas is kept to be supplied. After that, current of the filament is decreased and correspondingly, filament temperature is decreased. Accordingly, in decreasing the filament temperature, the material gas around the filament has been replaced with hydrogen or a rare gas.

24 Claims, 8 Drawing Sheets

P-channel type TFT   N-channel type TFT

MANUFACTURING METHOD OF SEMICONDUCTOR DEVICE

BACKGROUND OF THE INVENTION

1. Field of the Invention

The present invention relates to a method of manufacturing a semiconductor device by using a doping technique.

2. Description of the Related Art

As one step for manufacturing a semiconductor device, there is an ion injection step. The ion injection step is performed when forming source and drain regions in a semiconductor film, when forming a low-concentration impurity region containing an impurity at low concentration, or the like. For manufacturing one semiconductor device, ion injection steps in various conditions are required. For example, various kinds of ion injection steps are performed for manufacturing a semiconductor device in Patent Document 1.

In a present manufacturing process of a semiconductor device, a doping apparatus in which plasma is generated by arc discharge using a filament has been frequently used. This doping apparatus has been widely used because of the high-current density and easy application for a large-size substrate as compared with a conventional RF-discharge type doping apparatus. A filament is an electron generating means, and plasma is generated by applying voltage between an anode and the filament which is a cathode.

[Patent Document 1] Japanese Patent Laid-Open No. 2000-349298

In general, when ion injection is performed in various conditions in a manufacturing process of a semiconductor device, a plurality of doping apparatuses is used. For example, ion injection is performed at low concentration with a first doping apparatus, and then a substrate is moved into a second doping apparatus so that ion injection is performed at high concentration. However, the doping apparatus is required to be provided in number corresponding to the number of ion injection steps, thus, a plurality of doping apparatuses is required to be provided. In addition, substrate size has been increased in recent years and correspondingly, a doping apparatus has also been increased in size.

In such a situation, floor space of a factory is occupied by the ion doping apparatus, and there has been a problem that a manufacturing line cannot be constructed well. In addition, the number of apparatuses to be provided cost much.

On the other hand, when ion injection in various conditions is performed with the same doping apparatus in order to suppress the number of apparatuses, there has been another problem that a filament (also called an electron generating means) deteriorates in an arc discharge doping apparatus. In particular, the filament has deteriorated significantly in setting up for the next doping step performed with a lower filament current.

This is because the filament temperature also decreases along with the decrease of the filament current, and when the filament temperature becomes lower than the boiling point of an element contained in a material gas, the element becomes liquid near the filament so that it penetrates and deteriorates the filament. Therefore, in the case where ion injection is performed in various conditions with the same doping apparatus where filament deterioration occurs, it is necessary to replace the filament regularly, therefore, there has been a big problem of reduction of such down time.

Further, a material gas with high concentration has been used recently in many cases, which has escalated the problem of filament deterioration.

SUMMARY OF THE INVENTION

In view of the forgoing, it is an object of the present invention to provide a doping method by which floor space of a factory or the like can be efficiently utilized and filament deterioration is small.

According to the invention, in changing a doping condition, a material gas at least around an electron generating means of an ion doping apparatus is purged with hydrogen or a rare gas, and after the material gas at least around the electron generating means is sufficiently purged, a current to be supplied into the electron generating means is reduced. That is, an atmosphere around the electron generating means is switched from a material gas to hydrogen or a rare gas while maintaining a current to be supplied into the electron generating means in a first doping and thereafter, the current to be supplied into the electron generating means is reduced. Then, a material gas and a current to be supplied into the electron generating means in a second ion doping condition are set to perform a second ion doping.

Through the invention, even when a current to be supplied into the electron generating means is reduced and the filament temperature is decreased, a material gas around the electron generating means has been already purged with hydrogen or a rare gas, therefore, there is no element to become liquid on a surface of the electron generating means, thereby deterioration of the electron generating means can be suppressed.

As the electron generating means, there are a cold cathode such as a carbon nanotube, a filament, and the like.

Through the invention, lifetime of the electron generating means can be easily lengthened without special reconstruction of the apparatus. Therefore, the replacement frequency of the electron generating means can be reduced, so that operating rate of the apparatus can be increased and yield can be increased. In particular, the invention is efficient in an ion injection step with a large number of condition changes. Further, many kinds of doping steps can be performed with a small number of doping apparatuses, thereby floor space of a factory or the like can be efficiently utilized.

In addition, since the temperature of the electron generating means can be decreased while supplying hydrogen or a rare gas, the temperature of the electron generating means can be quickly decreased, and setup time until ion doping in the next condition can be shortened.

In addition, conventionally, after a first ion doping, a material gas with a concentration which is required for a second ion doping has been kept to be supplying until the concentration of the material gas for the second ion doping is stabilized in a doping chamber and thereafter, the second ion doping has been performed. However, according to the invention in which a step of purging with hydrogen or a rare gas is provided between the first ion doping and the second ion doping, an atmosphere of the doping chamber is reset once by the hydrogen or rare gas. Therefore, a material gas which is required for the second ion doping can be supplied after the atmosphere of the doping chamber is reset, so that a stabilized condition for the second ion doping can be obtained in shorter time than conventional one. Therefore, through the invention, setup time for ion doping can be shortened, and production efficiency can be improved.

DETAILED DESCRIPTION OF THE INVENTION

Figure 1:
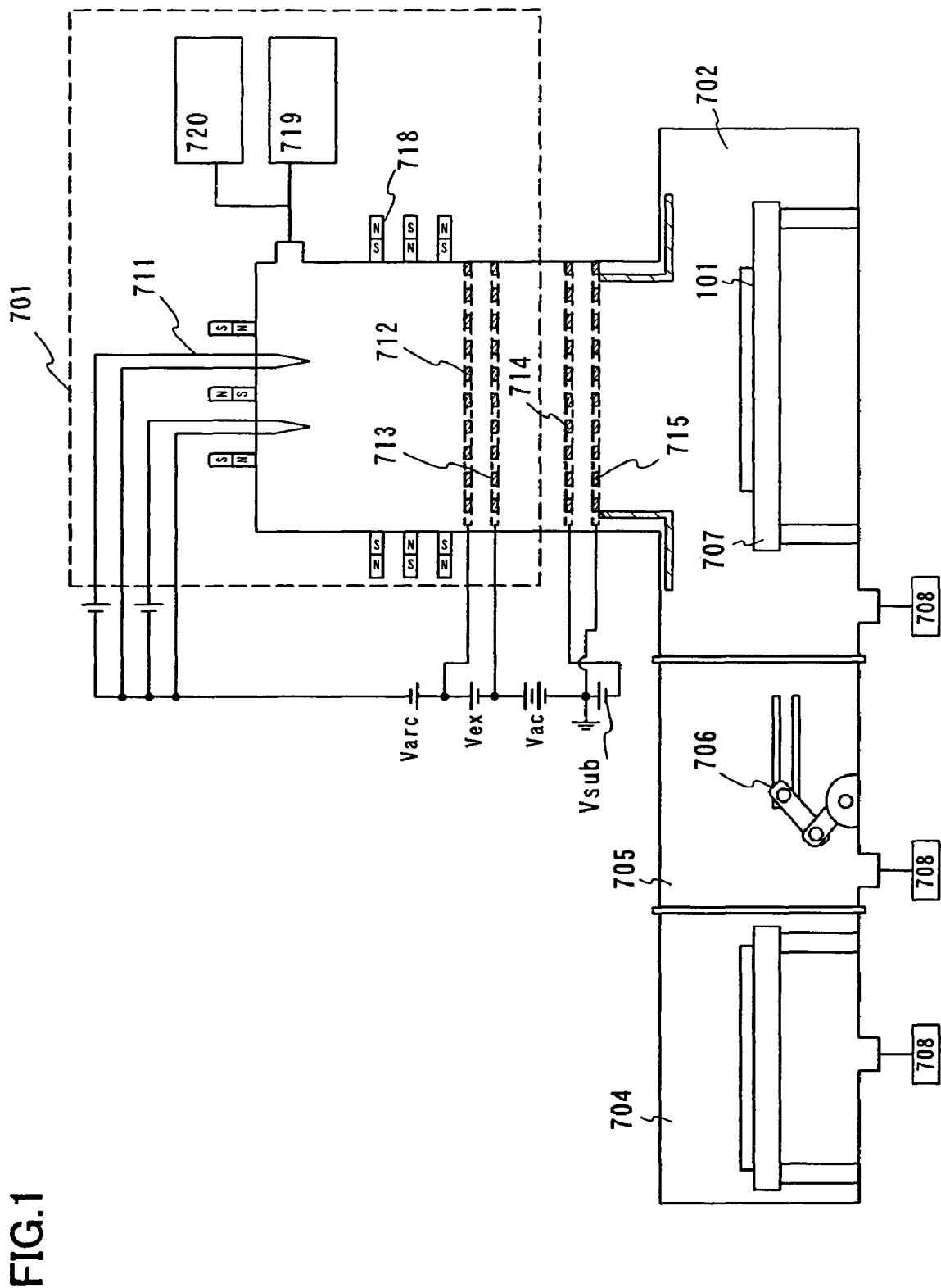
FIG. 1 shows an ion doping apparatus.

Although the invention will be fully described by way of embodiment modes and embodiments with reference to the accompanying drawings, it is to be understood that various changes and modifications will be apparent to those skilled in the art. Therefore, unless such changes and modifications depart from the scope of the invention, they should be construed as being included therein. In addition, identical portions in different drawings are denoted by the same reference numerals, and description thereof may be omitted.

Embodiment Mode 1

FIG. 1 shows an ion doping apparatus used in the invention. The ion doping apparatus shown in FIG. 1 includes a doping chamber 702, a load lock chamber 704, and a transfer chamber 705, and these chambers are connected through a gate valve. In addition, the transfer chamber 705 includes a transfer means 706 having a double arm. Though an evacuation means 708, each of the doping chamber 702, the transfer chamber 705, and the load lock chamber 704 can be evacuated. As the evacuation means 708, a dry pump, a mechanical booster pump, a turbo molecular pump, or the like is arbitrarily used in combination.

An ion source 701 which is part of the doping chamber 702 is provided with a gas supply system 719 for supplying a material gas, a gas supply system 720 for supplying a purge gas, and a filament 711 for forming plasma, like a general ion source. Additionally, a magnetic field applying means 718 for encapsulating generated electrons in the chamber is provided. The magnetic field applying means 718 is provided to obtain uniform plasma with high density. An anode with respect to the filament which is a cathode is a wall of the doping chamber 702 to which an arc voltage (Varc) is applied.

In the doping chamber 702, ion doping is performed using plasma formed by applying a voltage between the anode and the filament which is the cathode. In the case of treating a substrate having a large area, ion doping treatment to the entire surface thereof can be performed by scanning a substrate 101 on a stage 707. In such a case, by irradiating the substrate with an ion flow having a rectangular or linear cross-sectional shape, increase in size of the apparatus can be prevented. It is to be noted that the substrate is disposed horizontally so that the substrate surface is irradiated with an ion beam perpendicularly in the structure shown in FIG. 1, however, in order to reduce particles, such a structure may also be employed that a substrate is disposed perpendicularly so that the substrate surface is irradiated with an ion beam perpendicularly.

For forming an ion beam, the doping chamber 702 is provided with an extraction electrode 712, an acceleration electrode 713, a suppression electrode 714, and a ground electrode 715. These electrodes have many openings through which ions pass. Ions are accelerated by the extraction electrode 712 to which an extraction voltage (Vex) is applied and by the acceleration electrode 713 to which an acceleration voltage (Vac) is applied. The suppression electrode 714 catches and gathers scattering ions to increase directivity of the ion flow. When 1 to 20 kV is applied as the extraction voltage (Vex) and the acceleration voltage (Vac) is changed, ions can be accelerated with an energy of 10 to 100 keV.

The material gas for doping is phosphine ($PH_3$), diborane ($B_2H_6$), or the like, and is diluted down to about 0.1 to 20% with hydrogen or an inert gas. When $PH_3$ is used, $PH_x^+$, $P_2H_x^+$, $H_x^+$, and the like are generated as ion species, and if there is no mass separation, these ions are extracted almost linearly by the four electrodes 712 to 715 to irradiate the substrate.

Described next is an ion doping method with such an ion doping apparatus.

Figure 2:
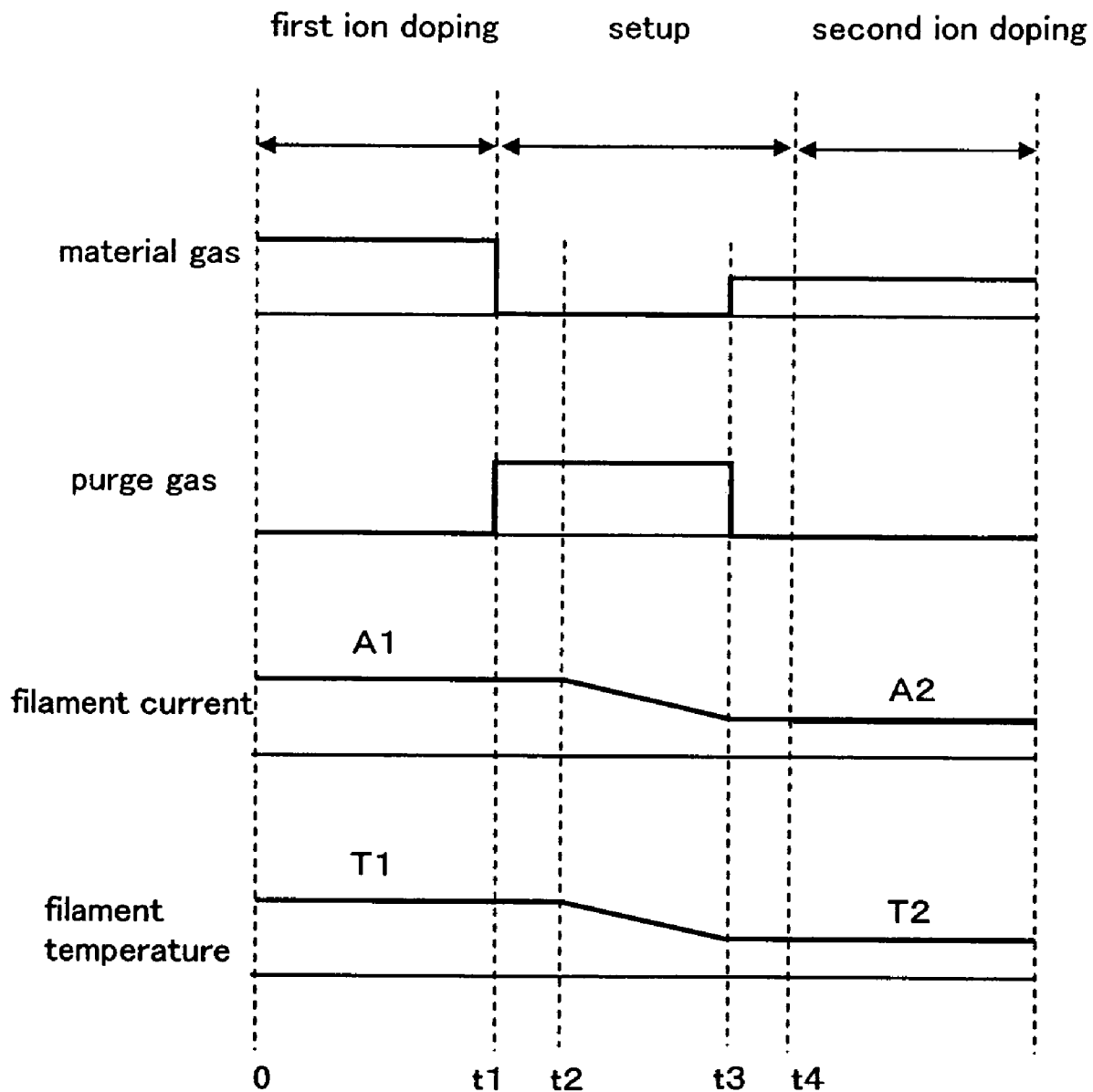
FIG. 2 illustrates a manufacturing method of a semiconductor device of the invention.

A doping method of the invention is described with reference to FIG. 2. FIG. 2 shows respective fluctuations of the material gas, the purge gas, the filament current, and the filament temperature over time in the case where a first ion doping and a second ion doping are performed. The first ion doping is performed with a filament current larger than that in the second ion doping. In addition, the first ion doping uses the material gas with a concentration higher than in the second ion doping.

First, when $0<t<t1$, the first ion doping is performed and the material gas is made into plasma. At this time, a filament current A1 flows into the filament, and the temperature of the filament is a temperature T1 which is proportional to the filament current A1.

Then, when $t=t1$, the first ion doping is completed. Supply of the material gas is stopped and the purge gas starts to be supplied. As the material gas, any gas of an element which does not react with the filament can be used, and for example, hydrogen or a rare gas can be used. When $t1<t<t2$, the same filament current A1 as is in the first ion doping is kept flowing into the filament and during this period, using the purge gas, the atmosphere of the doping chamber is switched from the material gas to the purge gas.

After the time when $t=t2$ where the material gas is replaced with the purge gas to some extent, the filament current is gradually reduced. Proportionally, the filament temperature is also decreased. Until when $t=t3$ where the filament current reaches a filament current A2 in the second ion doping condition, the filament current is kept to be reduced. When $t2<t<t3$, due to the purge gas being supplied, the filament temperature can be decreased more quickly, thereby a filament temperature T2 can be set in shorter time.

Then, when $t=t3$ where the filament current reaches the filament current A2 in the second ion doping condition, while keeping the filament current A2, it is waited that the filament temperature decreased along with the filament current is stabilized to T2. As for ion injection, the quantity of impurity for doping depends on the temperature of a doping chamber; therefore, stabilizing the temperature of the filament which is a heat source is extremely important for performing a stable second ion doping. In addition, when $t=t3$, supply of the purge gas is stopped and the material gas for the second ion doping starts to be supplied. Then, it is waited that the concentration of the material gas in the second ion doping condition is stabilized. After the time when $t=t4$ where the second ion doping condition such as the filament temperature and the concentration of the material gas is stabilized, the second ion doping is started.

Although the material gas starts to be supplied and supply of the purge gas is stopped when $t=t3$ in this embodiment mode, the material gas may start to be supplied and supply of the purge gas may be stopped when $t=t4$ where the second ion doping starts. Alternatively, supply of the purge gas may be stopped when $t=t3$ and the material gas in the second ion doping condition may start to be supplied when $t=t4$. It is an important point of the invention that there is no element for deteriorating the filament around the filament when decreasing the filament temperature along with the decrease in the filament current.

It is to be noted that the material gas for the first ion doping and the material gas for the second ion doping may be either the same or different. Further, when t1<t<t3 for setup, it is not required to apply a voltage to an extraction electrode system such as the extraction electrode 712, the acceleration electrode 713, the suppression electrode 714, and the ground electrode 715 in FIG. 1. This is because it is a requirement of the invention that an atmosphere at least around the filament is replaced with hydrogen or a rare gas when t1<t<t3.

Through the above-described method, deterioration of the filament during setup between the first ion doping and the second ion doping can be suppressed, thereby down time for replacement of the filament can be reduced. That is, ion injection in many conditions can be performed with one doping apparatus, therefore, a manufacturing method of a semiconductor device can be provided by which throughput is increased while reducing floor space occupied by an apparatus.

In addition, in the invention, in the setup between the first ion doping and the second ion doping, the material gas for the first ion doping is purged once with the purge gas from the doping chamber to reset the atmosphere of the doping chamber and thereafter, the material gas for the second ion doping is supplied. Therefore, compared with a conventional doping method in which an atmosphere of a doping chamber is not reset, time for stabilizing the concentration of the material gas for the second ion doping can be shortened so that setup time can be shortened.

Although the filament is used as an electron generating means in this embodiment mode, a cold cathode such as a carbon nanotube may also be used.

Embodiment Mode 2

Figure 3:
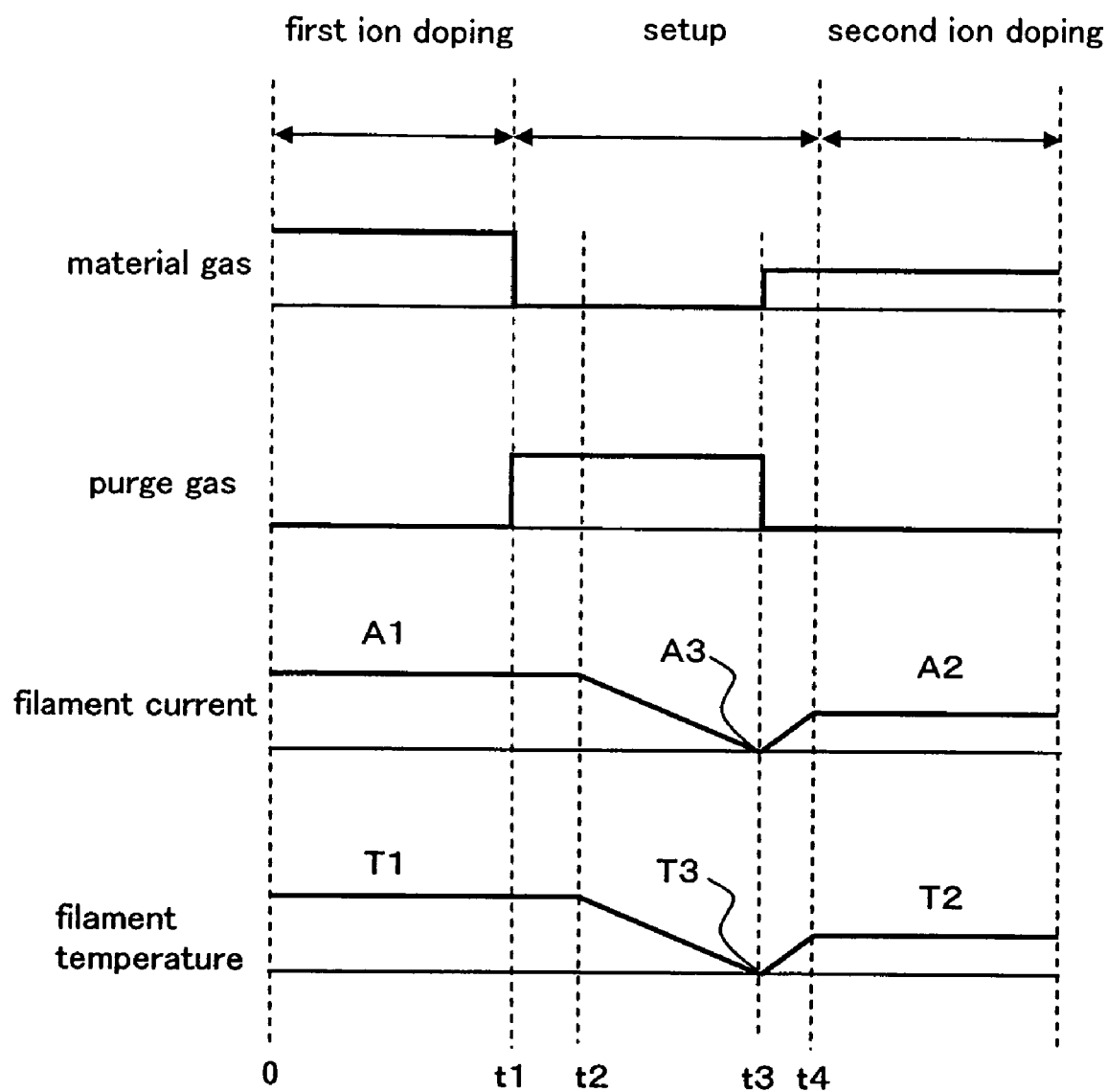
FIG. 3 illustrates a manufacturing method of a semiconductor device of the invention.

An ion doping method which is different from Embodiment Mode 1 is described with reference to FIG. 3. According to the method shown in FIG. 3, the filament current is gradually reduced to a value smaller than the filament current in the second doping condition when t2<t<t3 for gradually reducing the filament current, and except for this, this ion doping method is the same as Embodiment Mode 1.

When 0<t<t2, each gas and the filament are controlled similarly to the case of FIG. 2 in Embodiment Mode 1. Then, the filament current starts to be decreased gradually from the time when t=t2, and is decreased to reach a filament current A3 which is lower than the filament current A2 for the second ion doping. In this case, the filament current A3 may be 0 A (ampere). The filament temperature at this time is denoted by T3.

From the time when t=t3, the filament current starts to be increased to reach A2 in the second ion doping condition. Correspondingly, the filament temperature is also increased so that the filament temperature T2 for the second ion doping is stabilized. In addition, supply of the purge gas is stopped, and the material gas is kept flowing until the second ion doping condition is stabilized.

Then, after the time when the filament current reaches A2 and the filament temperature reaches T2 so that the second ion doping condition is stabilized (t=t4), the second ion doping is performed. Alternatively, at the time when t=t4, the material gas may be supplied and supply of the purge gas may be stopped. Further alternatively, supply of the purge gas may be stopped when t=t3, and the material gas in the second ion doping condition may start to be supplied when t=t4. It is an important point of the invention that there is no element for deteriorating the filament around the filament when decreasing the filament temperature along with the decrease in the filament current.

By performing setup for the second ion doping with the method in this embodiment mode, setup time can be shortened.

As for control of the filament temperature, there are two methods: to increase the filament temperature to obtain a desired temperature and to decrease the filament temperature to obtain a desired temperature. In the case of increasing the filament temperature, the filament temperature is increased naturally and proportionally by increasing the filament current; therefore, control of the filament temperature from T3 to T2 which is the filament temperature for the second ion doping can be performed in short time. To the contrary, in the case of decreasing the filament temperature, it is necessary to cool the filament itself by letting out heat around the filament, while at the same time reducing the filament current; therefore, it takes more time than the case of increasing the filament temperature. Thus, it takes some time to set the filament temperature to T2 for the second ion doping by decreasing the filament temperature as does in Embodiment Mode 1. However, control of the filament temperature from T3 to T2 by decreasing the filament temperature to the utmost and increasing the filament current again as does in this embodiment mode is efficient in that the setup time can be shortened.

In addition, in this embodiment mode, there is no problem of filament deterioration regardless of degree of filament temperature reduction, therefore, the filament temperature T3 can be set such that setup time is the shortest. Further, since the purge gas is supplied while decreasing the filament temperature, the filament temperature can be easily decreased, thereby setup time can be further shortened.

According to this embodiment mode, as well as the filament can be prevented from deteriorating between the first ion doping and the second ion doping, setup time until the second ion doping can be shortened. In addition, stability of the filament temperature T2 for the second ion doping is high, thereby variation of the doping amount in the second ion doping can be reduced.

Although the filament is used as an electron generating means in this embodiment mode, a cold cathode such as a carbon nanotube may also be used.

Embodiment 1

Described in this embodiment is a case where: boron is added at high concentration as a p-type impurity element to form a p-type impurity region at a first ion doping; and subsequently, boron which is a p-type impurity element is added at low concentration as a channel doping step at a second ion doping.

Figure 4A:
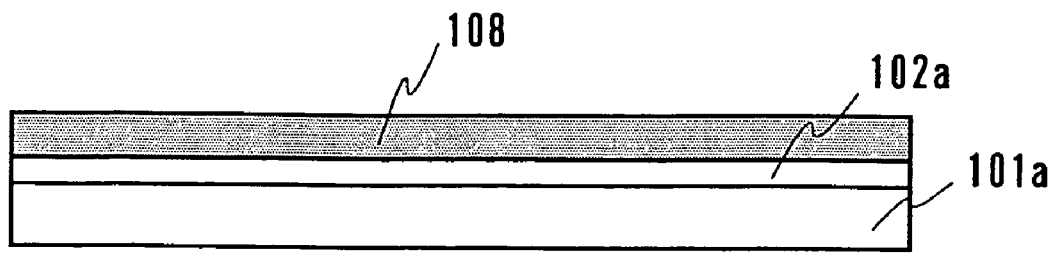
FIGS. 4A to 4C illustrate Embodiment 1.
Figure 4B:
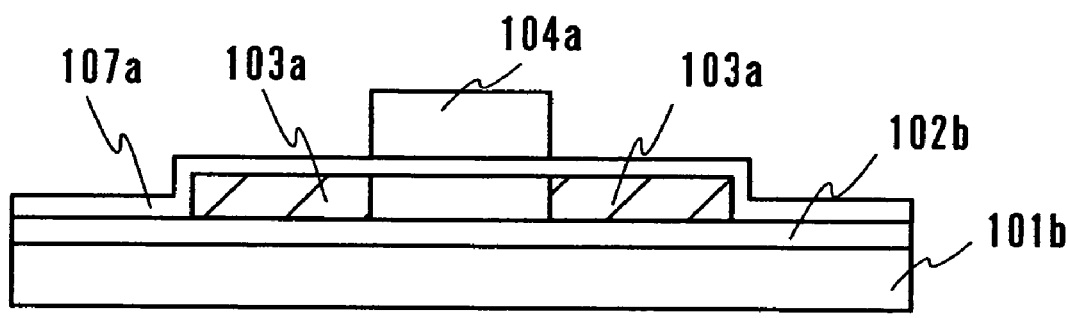
Figure 4C:
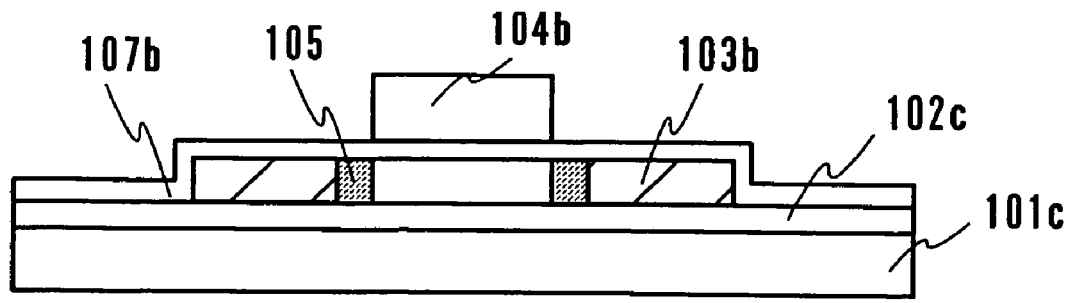

In FIG. 4A, a base film 102a is formed over a substrate 101a, and a semiconductor film 108 is formed thereover. In FIG. 4B, a base film 102b is formed over a substrate 101b, and a thin film transistor including a semiconductor layer, a gate insulating layer 107a, and a gate electrode 104a is formed thereover. In FIG. 4C, a base film 102c is formed over a substrate 101c, and a thin film transistor including a semiconductor layer, a gate insulating layer 107b, and a gate electrode 104b is formed thereover.

First, as a step of adding boron at high concentration that is a first ion doping step, there are formation of source and drain regions of a p-type thin film transistor and formation of a low-concentration impurity region thereof. For example, the first ion doping step may be a step of forming a high-concentration impurity region 103a which functions as a source or drain region, with the gate electrode 104a in FIG. 4B as a mask, may be a step of forming a high-concentration impurity region 103b which functions as a source or drain region, or may be a step of forming a low-concentration impurity region 105 with the gate electrode 104b in FIG. 4C as a mask.

On the other hand, a channel doping step that is a second ion doping step is a step of adding a p-type impurity element at low concentration into a channel formation region in order to control the threshold value of a thin film transistor. Here, boron is added by an i on doping method in which diborane ($B_2H_6$) is plasma-excited. In this step, a channel formation region containing a p-type impurity element (boron in this embodiment mode) at a concentration of $1\times10^{15}$ to $1\times10^{18}$ atoms/cm$^3$ (typically, $5\times10^{16}$ to $5\times10^{17}$ atoms/cm$^3$) is formed. In the case of a top-gate thin film transistor for which a channel doping step is required to be performed before a gate electrode is formed, the channel doping step is performed before patterning a semiconductor film in many cases. Specifically, as shown in FIG. 4A, plasma-excited diborane is added into the entire semiconductor film 108 which is formed over the substrate 101a with the base film 102a interposed therebetween.

Figure 5:
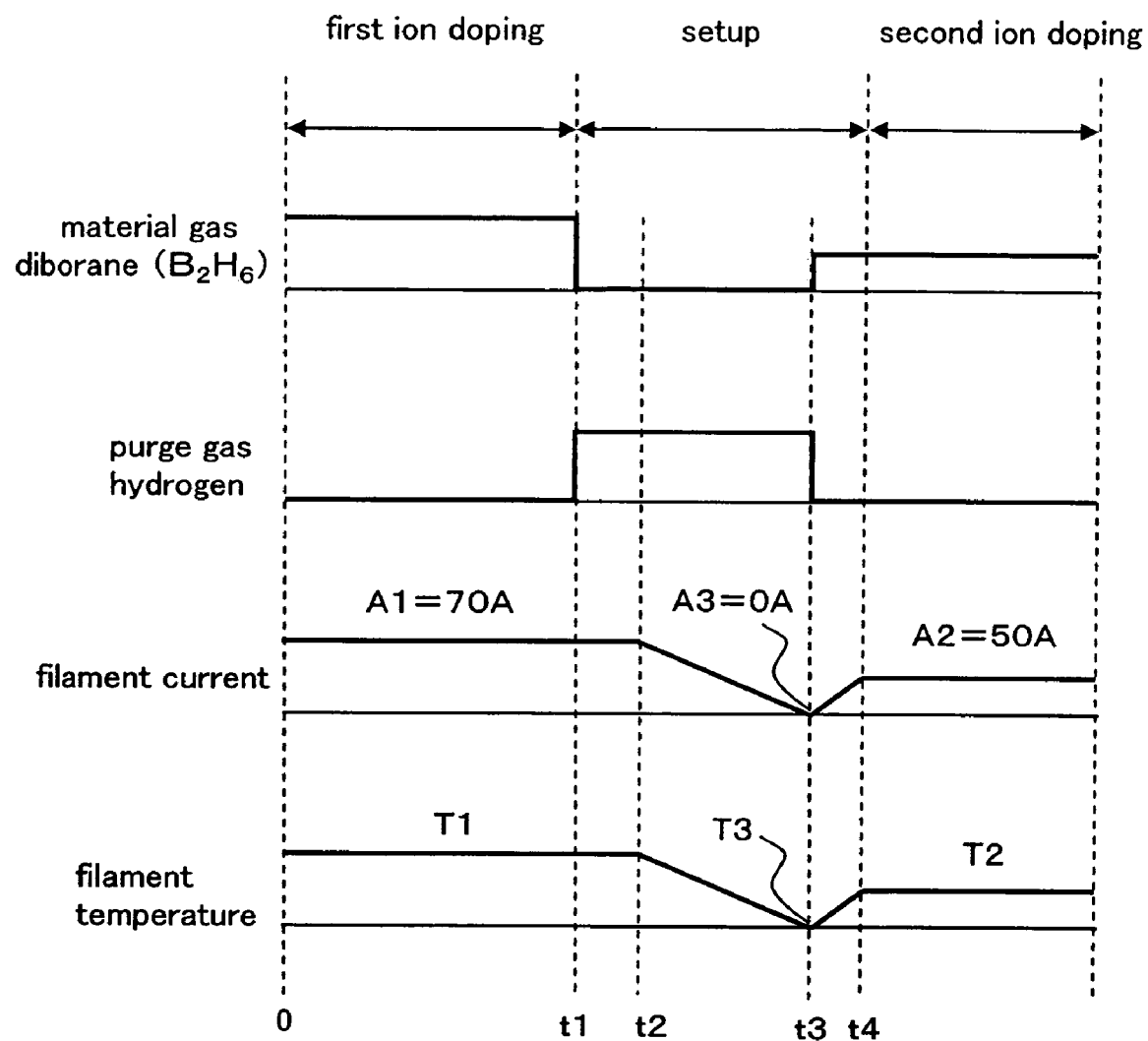
FIG. 5 illustrates Embodiment 1.

A doping method of this embodiment is described with reference to FIG. 5. First, the substrate 101b shown in FIG. 4B before the high-concentration impurity region 103a is formed is installed into a doping chamber, and a first ion doping is performed. During the first ion doping, diborane ($B_2H_6$) gas with a concentration of 15% which is diluted with hydrogen is supplied at a flow rate of 80 sccm and the filament current A1 is 70 A. In order to form the high-concentration impurity region 103a shown in FIG. 4B, diborane is made into plasma so that boron is added into a semiconductor layer with the gate electrode 104a as a mask.

Start of an ion doping into the substrate is controlled not by generating plasma, but by applying generated plasma to the substrate by applying a voltage to the extraction electrode or the acceleration electrode. Meanwhile, termination of the ion doping is controlled by stopping the voltage application to the extraction electrode or the acceleration electrode. Therefore, at the start of the first ion doping, plasma generation and substrate installation are completed before a voltage is applied to the extraction electrode or the acceleration electrode. Thus, the order of timing of generating plasma and timing of installing the substrate 101b into the doping chamber is not particularly limited, and can be arbitrarily determined.

When t=t1 where the first ion doping is completed, the substrate 101b is taken out and the supply of diborane gas is stopped while keeping the filament current of 70 A, and hydrogen of 100% is supplied at a flow rate of 80 sccm for 10 minutes when t1≦t≦t2. By this period, diborane gas is purged from an atmosphere of the doping chamber and the atmosphere is changed to hydrogen. Note that timing of taking out the substrate 101b may be anytime during a period from termination of the first ion doping to start of a second ion doping.

When t=t2, the filament current starts to be decreased from 70 A to 0 A for five minutes when t2≦t≦t3. During this period, hydrogen is supplied at a flow rate of 80 sccm.

When the filament current reaches 0 A (t=t3), the supply of hydrogen is stopped and diborane gas which is diluted with hydrogen at a concentration of 1% starts to be supplied at a flow rate of 30 sccm. In addition, the filament current is supplied again so that the filament current A2 in the second ion doping condition is increased to 50 A.

When the filament current A2 reaches 50 A and the filament temperature is stabilized (t=t4), the substrate 101a with the state as shown in FIG. 4A is moved into the ion doping apparatus, and boron is added at low concentration into the semiconductor film 108 as the second ion doping. Note that timing of installing the substrate 101a may be anytime during a period from taking out the substrate 101b to the start of the second ion doping.

Through the above-described doping method, a step of doping at high concentration for forming an impurity region of a thin film transistor and a step of doping at low concentration such as channel doping can be performed continuously. Through the invention, filament deterioration which occurs in the case of continuously performing the doping at high concentration and the doping at low concentration can be suppressed, thereby a semiconductor device can be manufactured with high yield.

In particular, the boiling point of boron is 3658° C., and the boiling point is further decreased in a doping step which is performed under reduced pressure; therefore, the boiling point of boron tends to be passed on in a period of decreasing the filament temperature from T1 to T3 or in a period of decreasing the filament temperature from T1 to T2. That is, applying the invention to the case where boron is added at high concentration is extremely efficient since the filament may easily deteriorate particularly in the case of adding boron.

Although described in this embodiment is the case where ion injection is performed to a thin film transistor, the invention may also be applied to a step of injecting ions directly into a semiconductor substrate to perform channel doping or to form an impurity region. In addition, in this embodiment, it is not necessarily required to form the base films 102a to 102c over the substrates 101a to 101c respectively, and the semiconductor layer may be formed directly over the substrates 101a to 101c.

Embodiment 2

Described in this embodiment is a case where: a p-type impurity element is added at high concentration as a first ion doping in order to form a p-type high-concentration impurity region; subsequently, a p-type impurity element is added at low concentration as a second ion doping in order to form a p-type low-concentration impurity region.

Figure 6A:
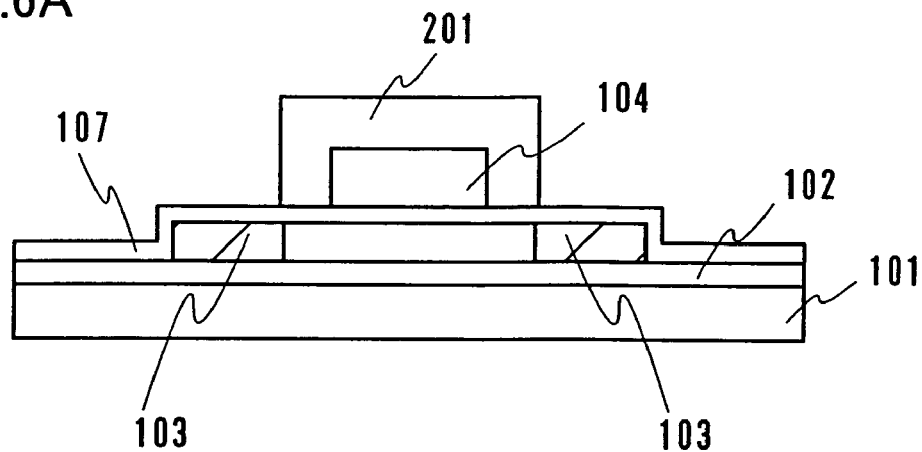
FIGS. 6A to 6C illustrate Embodiment 2.

As shown in FIG. 6A, a substrate 101 provided with a base film 102, a semiconductor layer, a gate insulating film 107, a gate electrode 104, and a mask 201 is installed into a doping chamber. Then, a first ion doping of adding boron at high concentration into the semiconductor layer by using the mask 201 is performed to form a p-type high-concentration impurity region 103 in the semiconductor layer. Note that timing of installing the substrate 101 may be anytime before the start of the first ion doping, and may be either before or after generating plasma.

After the first ion doping is completed, the substrate 101 is taken out of the doping chamber. Then, similarly to Embodiment Mode 1 or 2, a purge gas is supplied into the doping chamber while keeping the filament current so that setup for a second ion doping step is performed while suppressing filament deterioration. Note that timing of taking out the substrate 101 may be anytime during a period from termination of the first ion doping to start of a second ion doping.

Figure 6B:
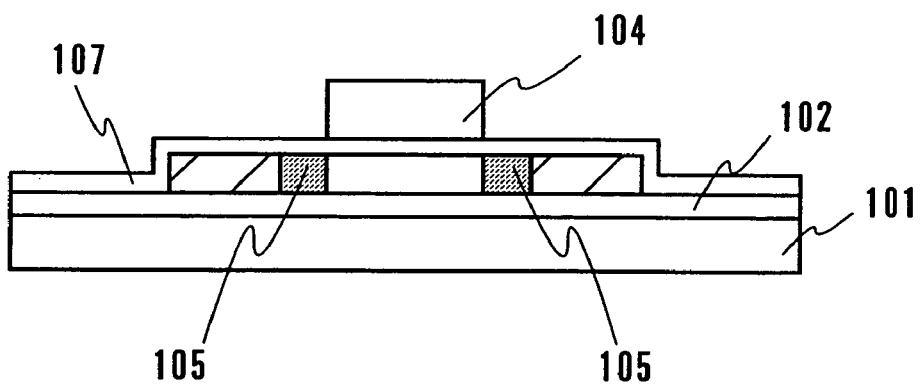

After the setup for a second ion doping, the substrate 101 with the mask 201 removed in the state of FIG. 6A is installed into the doping chamber, and the second ion doping is performed. As the second ion doping, boron with low concentration is added into the semiconductor layer with the gate electrode 104 as a mask, to form a p-type low-concentration impurity region 105 between a channel formation region and the high-concentration impurity region 103 as shown in FIG. 6B. Note that timing of installing the substrate 101 may be anytime during a period from removal of the mask 201 to the start of the second ion doping.

Figure 6C:
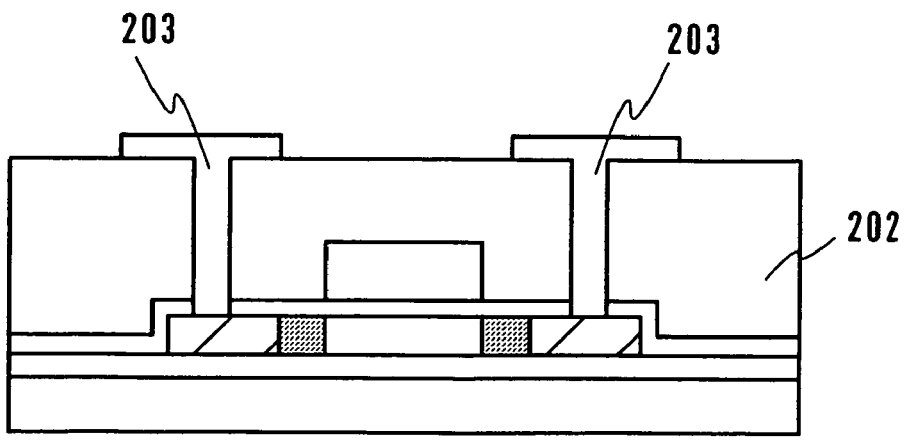

Then, after the second ion doping is completed, the substrate 101 is taken out of the doping chamber. Then, an interlayer insulating film 202 is formed over the gate electrode 104, and a contact hole is formed in the interlayer insulating film 202 so as to reach the high-concentration impurity region 103. Next, a conductive layer is formed to fill the contact hole and is patterned to form a wire 203 which is connected to the high-concentration impurity region 103 (FIG. 6C). Through the above steps, a semiconductor device with an LDD (Lightly Doped Drain) structure having the low-concentration impurity region 105 is completed.

In this embodiment, a step of etching the mask 201 is required between the first ion doping and the second ion doping. In order to perform these steps efficiently, a doping apparatus and an etching apparatus are preferably connected to each other to construct a multi-chamber which is used as one apparatus. An example thereof is shown in FIG. 7.

Figure 7:
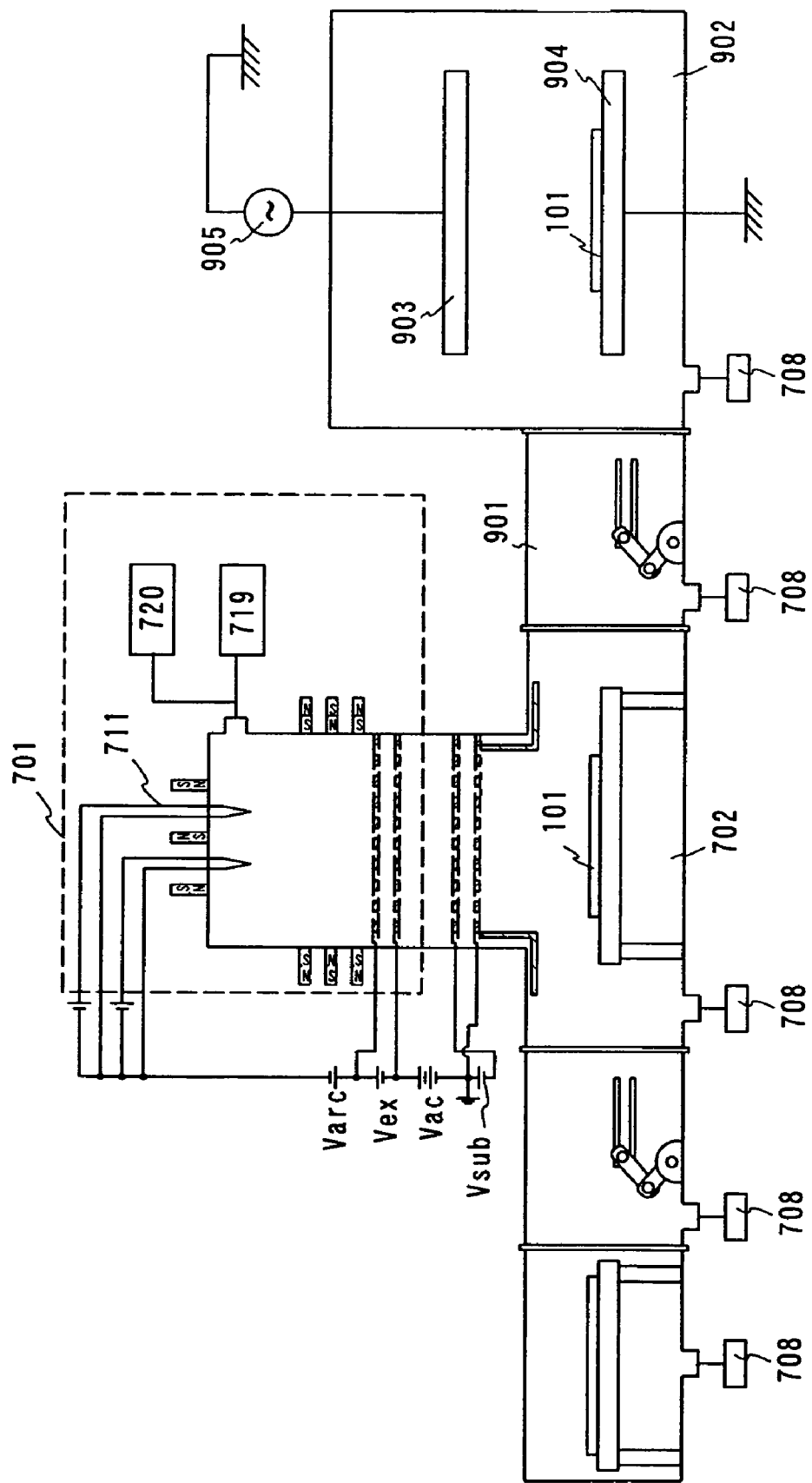
FIG. 7 illustrates Embodiment 2.

In FIG. 7, the ion doping apparatus shown in FIG. 1 and an etching apparatus 902 are shown. The ion doping apparatus and the etching apparatus 902 are connected through a transfer chamber 901 including a transfer means. Each of the etching apparatus 902 and the transfer chamber 901 is provided with the evacuation means 708. Electrodes 903 and 904 are provided for the etching apparatus 902, an RF power source 905 is connected to the electrode 903, and the substrate 101 is disposed on the electrode 904. Then, an electrical discharge is generated between the electrodes by power from the RF power source, thereby the mask 201 on the substrate 101 can be etched.

After the first ion doping is completed, the substrate 101 is transferred from the doping chamber 702 to the etching apparatus 902, and the mask 201 is etched in the etching apparatus 902. After the etching is completed and the doping chamber 702 satisfies the second ion doping condition, the substrate 101 is transferred to the doping chamber 702 and the second ion doping is performed. According to this, the steps can be performed continuously without exposing the substrate to external air, therefore, the substrate can be prevented from being contaminated.

Although described in this embodiment is the case where ions are injected into the semiconductor layer formed over the substrate 101, this embodiment may also be applied to the case where ions are directly injected into a semiconductor substrate to manufacture a semiconductor device. In addition, in this embodiment, it is not necessarily required to form the base film 102 over the substrate 101, and the semiconductor layer may be formed directly over the substrate 101.

Further, in the case of forming the low-concentration impurity region 105 with a metal mask or the like instead of the mask 201, there is no need of removing the mask 201. Therefore, the substrate 101 is not necessarily taken out between the first ion doping and the second ion doping, and may be kept in the doping chamber.

Embodiment 3

In this embodiment, a case where a p-type impurity element is added at high concentration as a first ion doping in order to form a p-type impurity region and subsequently, an n-type impurity element is added at low concentration as a second ion doping in order to form an n-type impurity region is described with reference to FIGS. 8A to 8E.

The base film 102 is formed over the substrate 101, and a first semiconductor layer 801 and a second semiconductor layer 802 are formed thereover. Over the first semiconductor layer 801 and the second semiconductor layer 802, the gate insulating film 107 is formed.

Figure 8A:
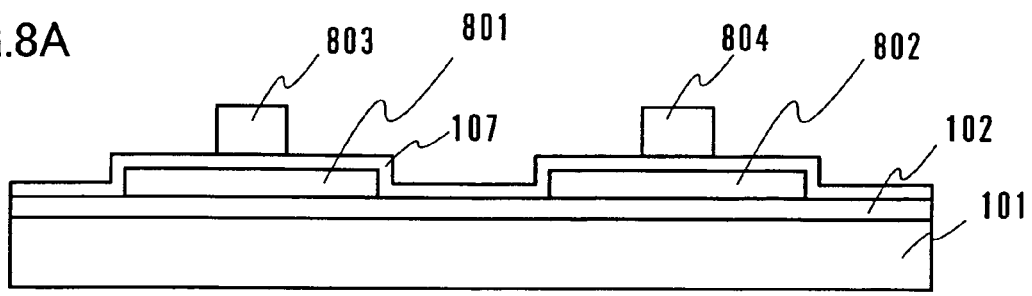
FIGS. 8A to 8E illustrate Embodiment 3.

Over the gate insulating film 107, a first gate electrode 803 and a second gate electrode 804 are formed. In this manner, a state of FIG. 8A is obtained.

Figure 8B:
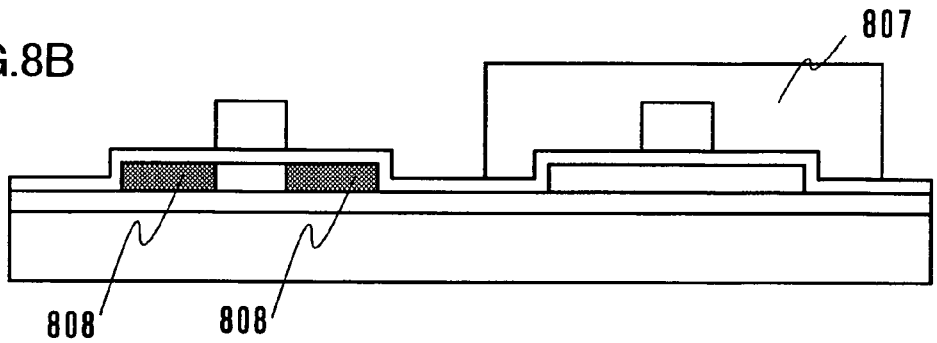

Next, as shown in FIG. 8B, a mask 807 is formed to cover the second semiconductor layer 802 and the second gate electrode 804. Then, boron is added at high concentration into the first semiconductor layer 801 with the first gate electrode 803 as a mask. Through this step, a source or drain region 808 of a p-type thin film transistor can be formed. This ion doping step corresponds to the first doping step of the invention described in Embodiment Mode 1 or 2.

Figure 8C:
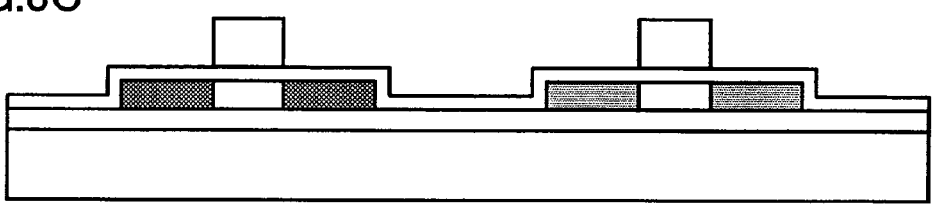

Next, after the mask 807 is removed by etching, phosphorus is added at low concentration into the first semiconductor layer 801 and the second semiconductor layer 802 with the first and second gate electrodes as masks, as the second ion doping step described in Embodiment Mode 1 or 2 (FIG. 8C). Through this step, the phosphorus is added at low concentration into the source or drain region 808 in the first semiconductor layer 801; however, since the concentration of phosphorus is extremely lower than the concentration of boron added into the source or drain region 808, p-type conductivity is kept in the source or drain region 808. On the other hand, the phosphorus is added at low concentration into a region other than a channel formation region in the second semiconductor layer 802.

Figure 8D:
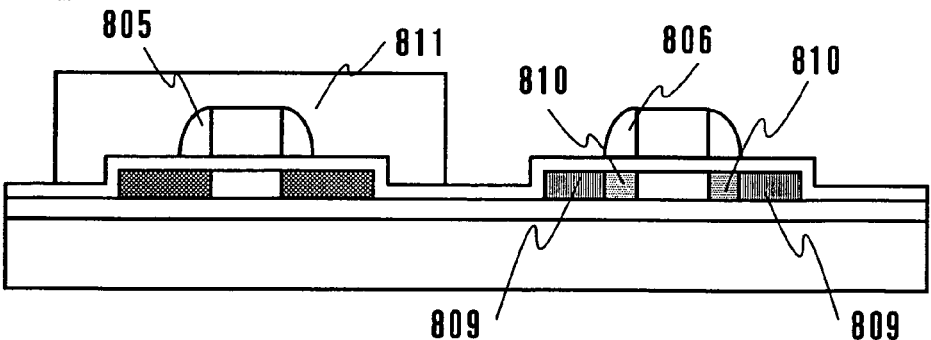

Next, dry etching is performed after an insulating layer is formed over the entire surface, so that sidewalls 805 and 806 are formed on both sides of the first gate electrode and the second gate electrode respectively. Further, a mask 811 is formed to cover the p-channel thin film transistor. With this state, phosphorus is added at high concentration into the second semiconductor layer 802 with the second gate electrode 804 and the sidewall 806 as a mask. In this manner, a source or drain region 809 and a low-concentration impurity region 810 are formed (FIG. 8D).

Figure 8E:
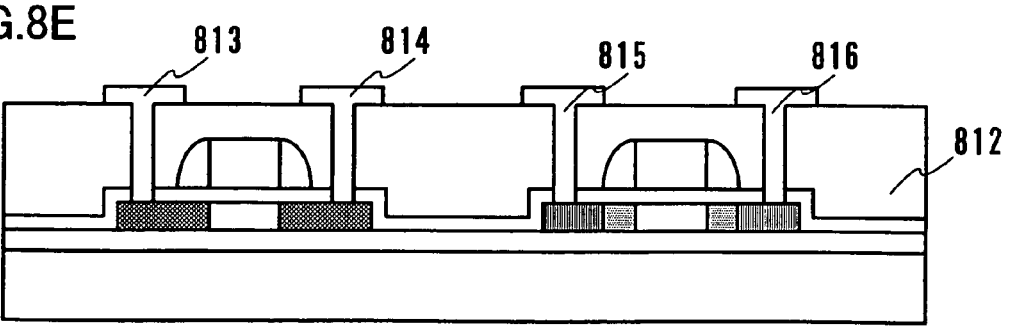

Next, after the mask 811 is removed, an interlayer insulating film 812 is formed over the first gate electrode 803 and the second gate electrode 804. Contact holes are formed in the interlayer insulating film 812, to reach the source and drain regions 808 and 809. A conductive layer is formed to fill the contact holes, and patterned to form wires 813 to 816 (FIG. 8E).

Through the above steps, a p-channel thin film transistor and an n-channel thin film transistor having an LDD structure are formed over the same substrate. By applying the invention between the first ion doping step of FIG. 8B and the second ion doping step of FIG. 8C, doping with reduced filament deterioration can be performed. In addition, time from start of the first ion doping to termination of the second ion doping can be shortened.

Further, the removal of the mask 807 by etching may be performed in the etching apparatus 902 which is connected to the doping chamber 702 shown in FIG. 7: after the first ion doping is completed, the substrate 101 is transferred from the doping chamber 702 to the etching apparatus 902; then, the mask 807 is etched and thereafter, the substrate 101 is transferred to the doping chamber 702 which satisfies the second ion doping condition to perform the second ion doping. In this case, setup time between the first ion doping and the second ion doping can be efficiently used, mask etching can be performed, and the substrate is not exposed to external air so that contamination thereof can also be prevented. In that case, setup time for the second ion doping can be utilized to remove the mask 807 by etching, and thus steps can be performed continuously.

Although described in this embodiment is the case where ions are injected into the semiconductor layer formed over the substrate 101, this embodiment may also be applied to the case where ions are directly injected into a semiconductor substrate to manufacture a semiconductor device. In addition, in this embodiment, it is not necessarily required to form the base film 102 over the substrate 101, and the semiconductor layer may be formed directly over the substrate 101.

This application is based on Japanese Patent Application Ser. No. 2005191532 filed in Japan Patent Office on 30th, Jun. 2005, the entire contents of which are hereby incorporated by reference.

What is claimed is:

1. A manufacturing method of a semiconductor device, comprising:
    performing an ion doping into a semiconductor layer in an ion doping apparatus having an electron generating means, with a state in which temperature of the electron generating means is a first temperature and a material gas is made into plasma;
    supplying hydrogen or a rare gas as purging gas into the ion doping apparatus and stopping supply of the material gas to replace an atmosphere around the electron generating means from the material gas to the hydrogen or rare gas, after the ion doping is completed; and
    decreasing the temperature of the electron generating means from the first temperature to a second temperature, after the hydrogen or rare gas is kept to be supplied.

2. The manufacturing method of a semiconductor device, according to claim 1, wherein the temperature of the electron generating means is gradually decreased from the first temperature to the second temperature.

3. The manufacturing method of a semiconductor device, according to claim 1, wherein no voltage is applied to an acceleration electrode and an extraction electrode which are provided for the ion doping apparatus, during a period in which the temperature of the electron generating means is decreased from the first temperature to the second temperature.

4. The manufacturing method of a semiconductor device, according to claim 1, wherein boron is added at high concentration into the semiconductor layer by the ion doping.

5. The manufacturing method of a semiconductor device, according to claim 1, wherein the temperature of the electron generating means decreases from the first temperature to the second temperature by reducing a current to be supplied to the electron generating means.

6. The manufacturing method of a semiconductor device, according to claim 1, wherein the electron generating means is a filament.

7. A manufacturing method of a semiconductor device, comprising:
    performing a first ion doping into a first semiconductor layer in an ion doping apparatus having an electron generating means, with a state in which temperature of the electron generating means is a first temperature and a first material gas is made into plasma;
    supplying hydrogen or a rare gas into the ion doping apparatus as well as stopping supply of the first material gas to replace an atmosphere around the electron generating means from the first material gas to the hydrogen or rare gas, after the first ion doping is completed;
    decreasing the temperature of the electron generating means from the first temperature to a second temperature, after the hydrogen or rare gas is kept to be supplied;
    supplying a second material gas as well as stopping supply of the hydrogen or rare gas, after the temperature of the electron generating means reaches the second temperature; and
    performing a second ion doping into a second semiconductor layer which is different from the first semiconductor layer, with a state in which the temperature of the electron generating means is the second temperature and the second material gas is made into plasma.

8. The manufacturing method of a semiconductor device, according to claim 7, wherein the temperature of the electron generating means is gradually decreased from the first temperature to the second temperature.

9. The manufacturing method of a semiconductor device, according to claim 7, wherein no voltage is applied to an acceleration electrode and an extraction electrode which are provided for the ion doping apparatus, during a period in which the temperature of the electron generating means is decreased from the first temperature to the second temperature.

10. The manufacturing method of a semiconductor device, according to claim 7, wherein boron is added at high concentration into the first semiconductor layer by the first ion doping, and boron or phosphorus is added at low concentration into the second semiconductor layer by the second ion doping.

11. The manufacturing method of a semiconductor device, according to claim 7, wherein the temperature of the electron generating means decreases from the first temperature to the second temperature by reducing a current to be supplied to the electron generating means.

12. The manufacturing method of a semiconductor device, according to claim 7, wherein the electron generating means is a filament.

13. A manufacturing method of a semiconductor device, comprising:
    performing a first ion doping into a semiconductor layer in an ion doping apparatus having an electron generating means, with a state in which temperature of the electron generating means is a first temperature and a first material gas is made into plasma;
    supplying hydrogen or a rare gas into the ion doping apparatus as well as stopping supply of the first material gas to replace an atmosphere around the electron generating means from the first material gas to the hydrogen or rare gas, after the first ion doping is completed;
    decreasing the temperature of the electron generating means from the first temperature to a second temperature after the hydrogen or rare gas is kept to be supplied;
    supplying a second material gas as well as stopping supply of the hydrogen or rare gas, after the temperature of the electron generating means reaches the second temperature; and
    performing a second ion doping into the semiconductor layer, with a state in which the temperature of the electron generating means is the second temperature and the second material gas is made into plasma.

14. The manufacturing method of a semiconductor device, according to claim 13, wherein the temperature of the electron generating means is gradually decreased from the first temperature to the second temperature.

15. The manufacturing method of a semiconductor device, according to claim 13, wherein no voltage is applied to an acceleration electrode and an extraction electrode which are provided for the ion doping apparatus, during a period in which the temperature of the electron generating means is decreased from the first temperature to the second temperature.

16. The manufacturing method of a semiconductor device, according to claim 13, wherein boron is added at high concentration into the semiconductor layer by the first ion doping, and boron or phosphorus is added at low concentration into the semiconductor layer by the second ion doping.

17. The manufacturing method of a semiconductor device, according to claim 13, wherein the temperature of the electron generating means decreases from the first temperature to the second temperature by reducing a current to be supplied to the electron generating means.

18. The manufacturing method of a semiconductor device, according to claim 13, wherein the electron generating means is a filament.

19. A manufacturing method of a semiconductor device, comprising:

performing an ion doping into a semiconductor substrate in an ion doping apparatus having an electron generating means, with a state in which temperature of the electron generating means is a first temperature and a material gas is made into plasma;

supplying hydrogen or a rare gas as purging gas into the ion doping apparatus and stopping supply of the material gas to replace an atmosphere around the electron generating means from the material gas to the hydrogen or rare gas, after the ion doping is completed; and decreasing the temperature of the electron generating means from the first temperature to a second temperature, after the hydrogen or rare gas is kept to be supplied.

20. The manufacturing method of a semiconductor device, according to claim 19, wherein the temperature of the electron generating means is gradually decreased from the first temperature to the second temperature.

21. The manufacturing method of a semiconductor device, according to claim 19, wherein no voltage is applied to an acceleration electrode and an extraction electrode which are provided for the ion doping apparatus, during a period in which the temperature of the electron generating means is decreased from the first temperature to the second temperature.

22. The manufacturing method of a semiconductor device, according to claim 19, wherein boron is added at high concentration into the semiconductor substrate by the ion doping.

23. The manufacturing method of a semiconductor device, according to claim 19, wherein the temperature of the electron generating means decreases from the first temperature to the second temperature by reducing a current to be supplied to the electron generating means.

24. The manufacturing method of a semiconductor device, according to claim 19, wherein the electron generating means is a filament.

* * * * *